(12) United States Patent
Basu et al.

(10) Patent No.: US 12,210,411 B2
(45) Date of Patent: Jan. 28, 2025

(54) HOST-BASED ERROR CORRECTION

(71) Applicant: Micron Technology, Inc., Boise, ID (US)

(72) Inventors: Reshmi Basu, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 17/991,287

(22) Filed: Nov. 21, 2022

(65) Prior Publication Data

US 2023/0100557 A1 Mar. 30, 2023

Related U.S. Application Data

(63) Continuation of application No. 16/441,839, filed on Jun. 14, 2019, now Pat. No. 11,537,464.

(51) Int. Cl.
| | |
|---|---|
| *G06F 11/10* | (2006.01) |
| *G06F 3/06* | (2006.01) |
| *G06F 11/07* | (2006.01) |
| *G06F 11/20* | (2006.01) |
| *H03M 13/35* | (2006.01) |

(52) U.S. Cl.
CPC ........ *G06F 11/1048* (2013.01); *G06F 3/0616* (2013.01); *G06F 3/064* (2013.01); *G06F 3/0679* (2013.01); *G06F 11/073* (2013.01); *G06F 11/1012* (2013.01); *G06F 11/2053* (2013.01); *H03M 13/35* (2013.01)

(58) Field of Classification Search
CPC .... G06F 11/1048; G06F 3/0616; G06F 3/064; G06F 3/0679; G06F 11/073; G06F 11/2053; G06F 11/1012; G06F 11/0727; G11C 16/08; G11C 16/14
See application file for complete search history.

(56) References Cited

U.S. PATENT DOCUMENTS

| | | | |
|---|---|---|---|
| 5,499,213 | A | 3/1996 | Niimi et al. |
| 5,537,429 | A | 7/1996 | Inoue |
| 5,805,799 | A | 9/1998 | Fredrickson et al. |
| 6,499,082 | B1 | 12/2002 | Lin et al. |

(Continued)

FOREIGN PATENT DOCUMENTS

WO 2011159806 A3 12/2011

*Primary Examiner* — Cynthia Britt
(74) *Attorney, Agent, or Firm* — Brooks, Cameron & Huebsch, PLLC

(57) ABSTRACT

Systems, apparatuses, and methods related to host-based error correction are described. Error correction operations can be performed on a host computing system as opposed to on a memory system. For instance, data containing erroneous bits can be transferred from a memory system to a host computing system and error correction operations can be performed using circuitry resident on the host computing system. In an example, a method can include receiving, by a host computing system, data that comprises a plurality of uncorrected bits from a memory system coupleable to the host computing system, determining an acceptable error range for the data based at least in part on an application associated with the data, and performing, using error correction logic resident on the host computing system, an initial error correction operation on the data based at least in part on the acceptable error range.

17 Claims, 3 Drawing Sheets

(56) References Cited

U.S. PATENT DOCUMENTS

| | | |
|---|---|---|
| 6,510,537 B1 | 1/2003 | Lee |
| 8,381,066 B2 | 2/2013 | Yamaga |
| 8,549,384 B1 * | 10/2013 | Huang ................. G06F 11/1012 714/48 |
| 8,659,847 B1 | 2/2014 | Yeung et al. |
| 9,152,495 B2 | 10/2015 | Osh et al. |
| 9,569,305 B2 * | 2/2017 | Mukai .................. G11C 11/419 |
| 9,785,501 B2 | 10/2017 | Alrod et al. |
| 9,799,381 B1 | 10/2017 | Tortorelli et al. |
| 11,016,844 B2 * | 5/2021 | Steiner .................. G11C 29/52 |
| 11,403,172 B2 * | 8/2022 | Whately ............. G06F 11/1068 |
| 2003/0033567 A1 | 2/2003 | Tamura et al. |
| 2006/0242488 A1 | 10/2006 | You |
| 2006/0282717 A1 | 12/2006 | Suda |
| 2007/0186040 A1 | 8/2007 | Kasahara et al. |
| 2008/0082736 A1 | 4/2008 | Chow et al. |
| 2008/0222491 A1 | 9/2008 | Lee et al. |
| 2010/0176365 A1 | 7/2010 | Park et al. |
| 2011/0060968 A1 | 3/2011 | Warren |
| 2013/0227199 A1 | 8/2013 | Liu et al. |
| 2014/0237205 A1 | 8/2014 | Takefman et al. |
| 2016/0117219 A1 | 4/2016 | Halbert et al. |
| 2017/0004040 A1 | 1/2017 | Chinnakkonda et al. |
| 2017/0185343 A1 | 6/2017 | Ray et al. |
| 2017/0242820 A1 | 8/2017 | Rupanagunta et al. |
| 2017/0300239 A1 | 10/2017 | Choi |
| 2018/0060171 A1 | 3/2018 | Suh |
| 2019/0056990 A1 | 2/2019 | Suh et al. |
| 2020/0042378 A1 | 2/2020 | Pele et al. |
| 2020/0076532 A1 | 3/2020 | Pandey |
| 2020/0151055 A1 * | 5/2020 | Eom .................... G06F 3/0659 |
| 2020/0159617 A1 * | 5/2020 | Cha .................... G06F 11/1068 |

\* cited by examiner

HOST-BASED ERROR CORRECTION

PRIORITY INFORMATION

This application is a continuation of U.S. application Ser. No. 16/441,839, filed on Jun. 14, 2019, the contents of which are incorporated herein by reference.

TECHNICAL FIELD

The present disclosure relates generally to semiconductor memory and methods, and more particularly, to apparatuses, systems, and methods for host-based error correction.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
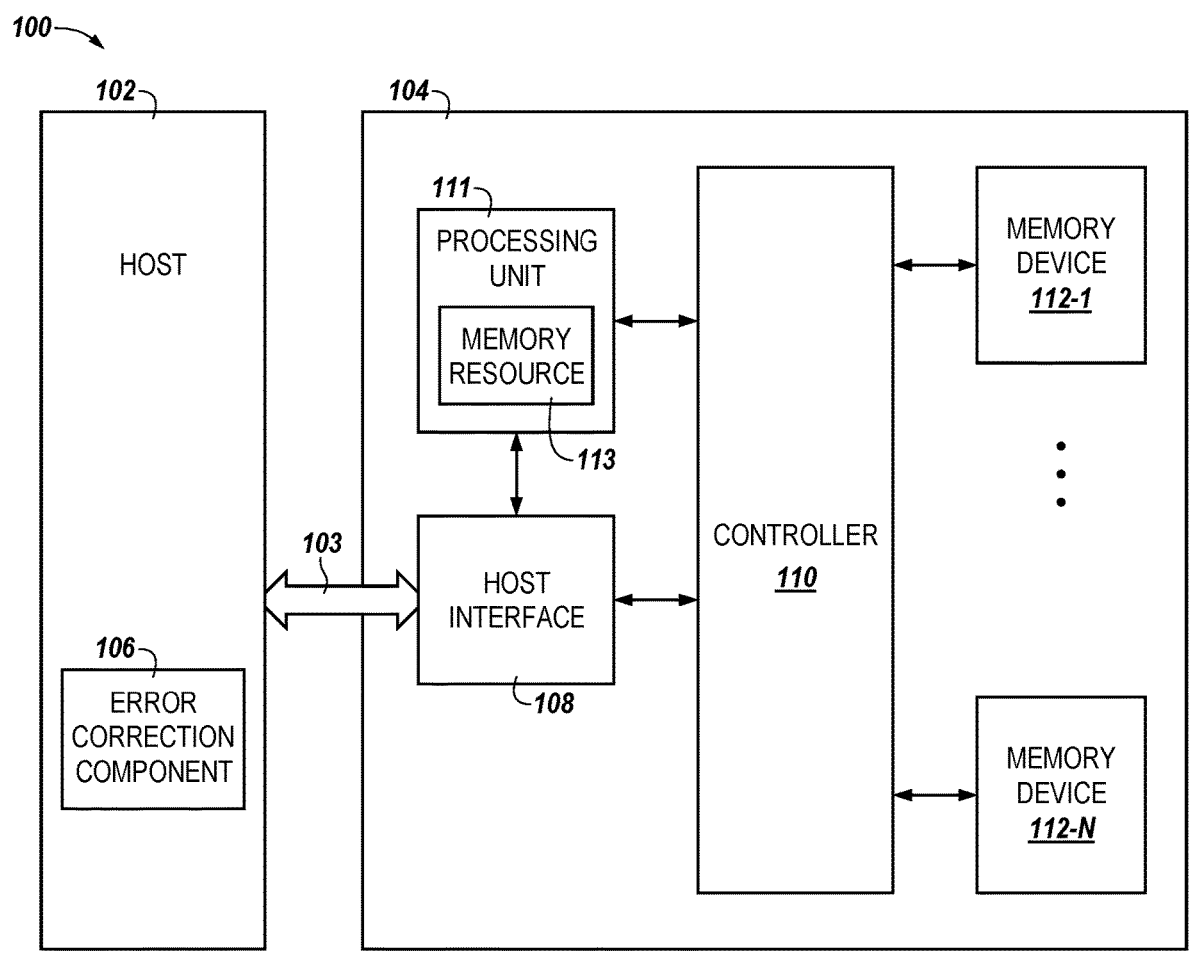
FIG. 1 is a functional block diagram in the form of a computing system including an apparatus including a memory system in accordance with a number of embodiments of the present disclosure.

Systems, apparatuses, and methods related to host-based error correction are described. Error correction operations can be performed on a host computing system as opposed to on a memory system. For instance, data containing erroneous bits can be transferred from a memory system to a host computing system and error correction operations can be performed using circuitry resident on the host computing system. In an example, a method can include receiving, by a host computing system, data that comprises a plurality of uncorrected bits from a memory system coupleable to the host computing system, determining an acceptable error range for the data based at least in part on an application associated with the data, and performing, using error correction logic resident on the host computing system, an initial error correction operation on the data based at least in part on the acceptable error range.

Memory devices, such as flash memory devices, may be used to store data in a computing system and can transfer such data between a host associated with the computing system. The data stored in a memory device can be important or even critical to operation of the computing system. Flash memory devices are utilized as non-volatile memory for a wide range of electronic applications. Flash memory devices typically use a one-transistor memory cell that allows for high memory densities, high reliability, and low power consumption.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix.

The gates of each floating gate memory cell of the array matrix are typically coupled by rows to word select lines and their drains are coupled to column bit lines. The NOR architecture floating gate memory array is accessed by a row decoder activating a row of floating gate memory cells by selecting the word select line coupled to their gates. The row of selected memory cells then place their data values on the column bit lines by flowing different currents depending on if a particular cell is in a programmed state or an erased state.

A NAND array architecture also arranges its array of floating gate memory cells in a matrix such that the gates of each floating gate memory cell of the array are coupled by rows to word select lines. However, each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 00, 01, 10, or 11. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing two bits can have three programmed states and an erased state.

Reading of memory cells can be accomplished by applying an appropriate voltage to the control gate and the drain and comparing the drain to source current, which can indicate the voltage threshold (Vt) of the cell, against a reference current, e.g., a "trip point," to determine the state of the memory cell. In an example data read operation, 0 volts can be applied to a selected word line, e.g., to the control gate of a cell or cells in the selected word line. A read pass voltage of about 5 volts can be applied to unselected word lines, e.g., to the control gates of cells in the unselected word lines. The drain to source current, e.g., the "cell current," or "drain current," flowing through cells on the selected word line, is indicative of the binary logic state of the cell.

As such, when the cell current of a particular memory cell is above the trip point, the memory cell is read as having a particular state, e.g., an erased state or a programmed state. When the cell current of the particular memory cell is below the trip point, the memory cell is read as having a different state. Therefore, a desired configured state of the memory cell, e.g., 00, 01, 10, or 11, depends on whether the cell current is above or below the trip point.

Memory cells having a state other than their desired/expected configured state, e.g., the state into which they were programmed, represent data errors in data being read. Many memory devices employ an error checking technique such as correction code (ECC) checking to detect bit errors in data, e.g., cells having incorrect states. The ECC codes can be associated with groups of cells, e.g., memory blocks, memory segments, or memory sectors, and can reduce read failures by detecting and possibly correcting bit errors. Examples of ECC codes include, Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes, among others.

Read failures occur when accessed data bits, e.g., memory cells representing information retrieved by a processor, have incorrect states. Reducing read failures increases the operational reliability of memory devices and/or systems. Error checking/correcting techniques may not be able to correct more than a threshold number of erroneous bits. Furthermore, many error checking techniques may not even be able to detect more than a particular number of erroneous bits for a given group of cells, e.g., a data word or data sector.

In some approaches, these and other error checking techniques are performed on the memory device by, for example, a controller located on the memory device. The memory device controller can be a media controller such as a non-volatile memory express (NVMe) controller that is tightly coupled to the memory device (e.g., the memory cells, blocks, sectors, etc. of the memory device).

As the size and quantity of data stored by memory devices increases, the quantity of erroneous bits in data (e.g., a group of cells, block, or sector of the memory device) stored by the memory device can increase as well. As the number of erroneous bits increases, more time and/or processing resources may be consumed in detecting and correcting the erroneous bits. For example, in some approaches, doubling the number of erroneous bits can approximately double the amount of time needed to decode the data and extract the correct data. Further, in some approaches, doubling the number of erroneous bits can increase the amount of processing resources used in decoding the data to extract the correct data.

Because the amount of space (and hence, the amount of space available to provide processing resources) available on a memory device can be limited due to various constraints such as form factors, cell densities, memory array architectures, power limitations, and/or desired storage capacities, it can be difficult to provide adequate processing resources on the memory device to perform error correction on data stored by the memory device. As a result, due to form factor and/or power consumption limitations, performance efficiency of the memory device can, in some approaches, be limited.

In addition, process variability in memory device manufacture can lead to negative impacts on the lifetime of memory devices. For example, process variability can lead to memory devices that can incur additional erroneous bits over a given lifetime than other memory devices. As process technology trends toward smaller memory cells, the effects of process variability can become even more pronounced. In order to account for the effects of process variability and the effects of increasingly smaller memory cells on process variability, the strength demanded of error correction for memory devices can increase, which can lead to a loss of data throughput for the memory device.

As a result, in approaches in which error correction is performed on the memory device (e.g., using a controller or other circuitry resident on the memory device), the amount of time used for error correction can be undesirably large because the processing resources may be inadequate to quickly provide error correction to erroneous bits in data. Further, because the processing resources available on the memory device may be inadequate to perform error correction operations, especially in memory devices that are capable of storing large amounts of data, erroneous bits present in the data may not be accurately corrected, which can lead to incorrect data being provided to the computing system or, in some cases, failure of the computing system. As used herein, the term "resident on" refers to something that is physically located on a particular component. For example, the error correction being performed "resident on" the memory device refers to a condition in which the error correction is physically performed on the memory device. The term "resident on" may be used interchangeably with other terms such as "deployed on" or "located on," herein.

As storage capability of memory devices increases, these effects can become more pronounced as more and more data are able to be stored by the memory device thereby increasing the quantity of erroneous bits introduced to the data. These effects can be further exacerbated by the limitations of some approaches to error correction provided on memory devices described above, especially as the amount of data stored in memory devices and the speed at which data retrieval is expected.

In contrast, embodiments herein are directed to performance of error correction operations using circuitry external to the memory device. For example, in some embodiments, error correction can be performed by a host (e.g., a host computing device) coupled to the memory device. The host can include specialized circuitry (e.g., hardware, logic, integrated circuits, etc.) in the form of an error correction component to perform error correction operations on data received from the memory device.

Embodiments herein can allow for data to be transferred from the memory device to the host for error correction. As a result, in some embodiments, the memory device may not perform error correction on data stored thereby. By performing error correction on the host, error correction circuitry provided on the memory device in some approaches can be reduced or eliminated, thereby increasing the limited space available on the memory device for other components (e.g., for additional storage, etc.).

As described herein, the host can perform error correction operations that are performed by a memory device or memory system (e.g., initial error correction operations) in some approaches in addition to, or in lieu of, error correction operations that can be performed by the host in some approaches. As used herein, "initial error correction operations" refer to error correction operations that are performed on raw data that has not had an error correction operation of any kind performed on it. For example, an initial error correction operation can include an operation to correct errors on data stored by a memory system or memory device that arise as a result of the nature of the storage characteristics of the memory system or memory device. Initial error correction operations are distinguished from post-error correction operations in which data incurs one or more post-error correction operations to detect or correct residual errors (e.g., undetectable and/or uncorrectable errors) that may be present in data subsequent to performance of an initial error correction operation.

In some approaches, a host may perform post-error correction operations such as operations to detect and/or correct undetectable and/or uncorrectable errors that are present in data subsequent to error correction by the memory device. However, in embodiments described herein, the host can perform initial error correction operations that are performed by the memory device in some approaches in addition to post-error correction operations such as operations to detect and/or correct undetectable and/or uncorrectable errors in data that has had an initial error correction operation performed thereon.

In addition, because the host can, in some embodiments, include more powerful processing resources than the memory device, error correction can be performed on the host faster and/or more thoroughly than in approaches in which the error correction is performed on the memory device. This can improve performance of a computing system in comparison to approaches in which the error correction is performed on the memory device by allowing for improved throughput of data from the memory device that can be lost in some approaches due to stringent and/or time consuming error correction processes using the limited resources available to the memory device.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N," "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 106 may reference element "06" in FIG. 1, and a similar element may be referenced as 206 in FIG. 2. A group or plurality of similar elements or components may generally be referred to herein with a single element number. For example, a plurality of reference elements 112-1, 112-2, . . . , 112-N (e.g., 112-1 to 112-N) may be referred to generally as 112. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a memory system 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory system 104 can be a solid-state drive (SSD), for instance, and can include a host interface 108, a controller 110, e.g., a processor and/or other control circuitry, and a number of memory devices 112-1 to 112-N, e.g., solid state memory devices such as NAND flash devices, which provide a storage volume for the memory system 104. In a number of embodiments, the controller 110, a memory device 112-1 to 112-N, and/or the host interface 108 can be physically located on a single die or within a single package, e.g., a managed NAND application. Also, in a number of embodiments, a memory, e.g., memory devices 112-1 to 112-N, can include a single memory device.

As illustrated in FIG. 1, the controller 110 can be coupled to the host interface 108 and to the memory devices 112-1 to 112-N via one or more channels and can be used to transfer data between the memory system 104 and a host 102. The interface 108 can be in the form of a standardized interface. For example, when the memory system 104 is used for data storage in a computing system 100, the interface 108 can be a serial advanced technology attachment (SATA), peripheral component interconnect express (PCIe), or a universal serial bus (USB), a double data rate (DDR) interface, among other connectors and interfaces. In general, however, interface 108 can provide an interface for passing control, address, data, and other signals between the memory system 104 and a host 102 having compatible receptors for the host interface 108.

The host 102 can be a host system such as a personal laptop computer, a desktop computer, a digital camera, a mobile telephone, an internet-of-things (IoT) enabled device, or a memory card reader, graphics processing unit (e.g., a video card), among various other types of hosts. The host 102 can include a system motherboard and/or backplane and can include a number of memory access devices, e.g., a number of processing resources (e.g., one or more processors, microprocessors, or some other type of controlling circuitry). One of ordinary skill in the art will appreciate that "a processor" can intend one or more processors, such as a parallel processing system, a number of coprocessors, etc. The host 102 can be coupled to a host interface 108 of the memory system 104 by a communication channel 103.

In some embodiments, the host 102 can be responsible for executing an operating system for a computing system 100 that includes the memory system 104. Accordingly, in some embodiments, the host 102 can be responsible for controlling operation of the memory system 104. For example, the host 102 can execute instructions (e.g., in the form of an operating system) that manage the hardware of the computing system 100 such as scheduling tasks, executing applications, controlling peripherals, etc.

The computing system 100 can include separate integrated circuits or the host 102, the memory system 104, the error correction component 106, the host interface 108, the controller 110, and/or the memory devices 112-1 to 112-N can be on the same integrated circuit. The computing system 100 can be, for instance, a server system and/or a high-performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture.

In some approaches, the memory system 104 (e.g., the controller 110), can use an error checking technique such as an error correction code (ECC) to determine whether data (e.g., a memory cell and/or a group of cells, e.g., a data word, or sector) stored in the memory devices 112-1 to 112-N, is erroneous, e.g., has an incorrect state. An erroneous or incorrect state can refer to a state of a memory cell other than the one into which it was programmed or written. For example, non-volatile memory cells can be programmed into a particular logic state, e.g., 1 or 0, and can undergo a program verify operation to confirm that the cell was programmed to the desired correct state. In such approaches, if erroneous bits are detected, error correction operations can be performed on the data by the memory system 104.

In contrast, as shown in FIG. 1, the host 102 can include an error correction component 106, which can use an error checking technique such as ECC to determine whether data (e.g., a memory cell and/or a group of cells, e.g., a data word, or sector) of the memory devices 112-1 to 112-N, is erroneous. The error correction component 106 can include, for example, a number of components in the form of hardware and/or firmware, e.g., one or more integrated circuits, and/or software for performing error correction operations on data received by the host 102 from the memory system 104. The error correction component 106 can include one or more sub-components, such as the error correction code (ECC) encode component 214 and/or the ECC decode component 216 illustrated and described in connection with FIG. 2, herein.

The error correction component 106 can include hardware and/or firmware to perform error correction operations according to a Bose, Chaudhuri, and Hocquenghem (BCH) error correction scheme, a low-density parity check (LDPC) error correction scheme, a Hamming error correction scheme, a classification code error correction scheme, and/or other type of error correction scheme for instance, which can facilitate error correction on data transferred between the memory devices 112-1 to 112-N and the host 102.

In some embodiments, the error correction component 106 can receive data from the memory system 104 via, for example, the host interface 108. The data may be encoded according to one or more ECC schemes prior to being transferred from the memory system 104 to the host 102 and, ultimately, the error correction component 106. For example, the controller 110 can, in some embodiments, encode the data according to one or more ECC schemes prior to transferring the data to the error correction component 106. If the error correction component 106 receives data that has been previously encoded according to one or more ECC schemes by the memory system 104, the error correction component 106 can decode the data according to one or more ECC schemes as part of performance of an error correction operation.

Embodiments are not so limited, however, and in some embodiments, the error correction component 106 can receive unencoded data from the memory system 104 and encode and/or subsequently decode the data according to one or more ECC schemes. As a result, the error correction component 106 can be responsible for performing all (or at least a portion of) error correction operations for the computing system 100. That is, in some embodiments, no error correction on data may be performed by the memory system 104 and, instead, the data can be error corrected exclusively on the host 102, e.g., by the error correction component 106 that is resident on (e.g., tightly coupled to) the host 102. As used herein, the term "resident on" refers to something that is physically located on a particular component. For example, the error correction component being "resident on" the host refers to a condition in which the error correction component is physically coupled to the host. The term "resident on" may be used interchangeably with other terms such as "deployed on" or "located on," herein.

Embodiments are not limited to an "all-or-nothing" approach in which all error correction operations are performed on the host 102, however, and in some embodiments, data can be selectively transferred to the host 102 for error correction. For example, in some embodiments, certain data may be selectively transferred to the host 102 for error correction, while other data may be error corrected on the memory system 104. This can allow for data that requires a high level of accuracy (e.g., critical data), data that may take greater then a threshold amount of time to error correct, etc. to be error corrected on the host 102 while data that requires a lower level of accuracy and/or that can be error corrected within less than a threshold amount of time to be error corrected on the memory system 104. Further, by selectively error correcting certain data on the host 102 and error correcting other data on the memory system 104, data that is more likely to include greater than a threshold quantity of errors can be error corrected on the host 102 while data that is less likely to include greater than a threshold quantity of errors can be error corrected on the memory system 104. In addition, this can allow for parallel error correction to be performed on different data (e.g., different memory cells and/or groups of cells, data words, or sectors) of the memory devices 112-1 to 112-N, which can increase error correction throughput of data in comparison to approaches in which error correction is performed solely on the memory system 104.

In a non-limiting example, the error correction component 106 can determine that some data to be error corrected requires a higher level of error correction (e.g., higher precision, etc.) than other data stored by the memory system 104. For example, the error correction component 106 can determine that a first block of data is critical to performance of the computing system 100 and a second block of data is less critical to performance of the computing system 100. The error correction component 106 can assign a higher error correction priority to the first block of data and perform an error correction operation on the first block of data in response to the determination. Depending on the criticality of the second block of data, in this example, the error correction component 106 can either perform an error correction operation on the second block of data subsequent to performance of the error correction operation on the first block of data or the error correction component 106 can instruct the memory device 104 to perform an error correction operation on the second block of data in, for example, parallel with performance of the error correction operation on the first block of data.

In the above example, the error correction component 106 can assign a score or rating to data stored by the memory device 104 as part of determining which data is to be prioritized in error correction or which data is to be error corrected by the error correction component 106 and/or the memory system 104. These scores can be based on the criticality of the data, an amount of time allowed to perform an error correction operation (e.g., if a longer amount of time to perform error correction is allowed, the error correction component 106 can perform error correction using a higher number of iterations than the memory system 104), etc.

By ranking the data and selectively performing error correction on the data based on the rankings using the error correction component 106, error correction reliability can be improved in comparison to approaches in which error correction performed solely by the memory system 106. For example, by utilizing the additional processing resources available to the host 102 in performing error correction, a higher precision of error correction can be realized in comparison to approaches in which error correction is performed solely using circuitry available on the memory system 104. Further, by selectively performing some error correction using the error correction component 106 and some error correction using the memory system 104 (e.g., the controller 110 on the memory system 104), error correction can be performed concurrently (e.g., in parallel) on data stored by the memory system 104, which can improve data throughput in comparison to approaches in which error correction is solely performed using the memory system 104.

In some embodiments, by performing error correction operations (e.g., initial error correction operations) using the error correction component 106 resident on the host 102, a greater amount of processing resources may be available for use in performing error correction operations than in approaches in which error correction operations are performed on the memory system 104. For example, due to space constraints typically associated with a memory system, such as the memory system 104, hardware resources may be more than limited than hardware resources available to a host computing system such as the host 102. The constrained hardware resources available to the memory system 104 can lead to trade-offs between speed, power consumption, and/or accuracy (e.g., a reduced residual bit error rate (RBER)), among other factors when performing error correction operations using the memory system 104.

In contrast, by performing error correction operations (e.g., on uncorrected data) on the host 102 using the error correction component 106 described herein, increased hardware resources can be available for performing error correction operations, which can mitigate or, in some embodiments, eliminate, the trade-offs characteristic of approaches in which error correction operations are performed on the memory system 104, which can lead to improved error correction performance and/or improved data throughput. That is, by performing error correction operations on the host 102 using the error correction component 106, as described herein, more hardware resources can be made available for performing error correction operations than can be made available when performing error correction operations on the memory system 104, which can reduce an amount of time to perform error correction operations, reduce the RBER, and/or provide improved data accuracy in comparison to approaches in which the error correction operations are performed on the memory system 104.

In some embodiments, the error correction component 106 can perform operation to detect and/or correct undetectable or uncorrectable errors in data received form the memory system 104. However, the error correction operations described herein that are performed by the error correction component 106 can be distinct from operations to detect and/or correct undetectable or uncorrectable errors in the data received from the memory system 104. For example, in approaches in which the memory system 104 (e.g., the controller 110) performs error correction operations, uncorrectable and/or undetectable errors may be handled by the host 102 or other circuitry deployed on the host 102.

In contrast, embodiments herein can allow for performance of error correction operations using the error correction component 106 prior to performance of operations to detect and/or correct uncorrectable and/or undetectable errors. As a result, the error correction component 106 can perform error correction operations (e.g., initial error correction operations) that are performed by the memory system 104 in some approaches in addition to operations to detect and/or correct undetectable and/or uncorrectable errors (e.g., final error correction operations).

In some embodiments, the error correction component 106 can perform operations in addition to error correction operations. For example, the error correction component 106 can perform error detection operations. For example, the error correction component 106 can perform a cyclic redundancy check (CRC) to detect accidental changes in the data. A CRC can include a check value that represents a redundancy attached to data to be checked for errors. The CRC can further include a cyclic code that is used to generate the check value and/or an expected check value. The check value can be compared to the expected check value (e.g., the check value calculated using the cyclic code) to detect errors in the data—if the check value attached to the data does not match the expected check value, the data contains one or more errors.

For example, the error correction component 106 can verify that a check value attached to the data matches an expected check value. In some embodiments, the check value can be attached to the data by the memory system 104 (e.g., by the controller 110) prior to transferring the data to the host 102 and the error correction component 106 can calculate an expected check value and compare the calculated expected check value to the check value received with the data to verify that the expected check value matches the check value attached to the data. Embodiments are not so limited, however, and in some embodiments, the error correction component 106 can attach a check value to the data received from the memory system 104 and subsequently calculate an expected check value, which can then be compared to the check value attached by the error correction component 106 to verify that the expected check value matches the check value attached to the data by the error correction component 106. In some embodiments, the error correction component 106 can perform error correction operations on data in response to determining that the expected check value does not match the check value attached to the data (e.g., that the data contains erroneous bits).

The error correction component 106 can also, in some embodiments, control wear leveling operations for the memory system 104. For example, the error correction component 106 can track which sectors of the memory system 104 (e.g., sectors of the memory device 112-1 to 112-N) incur data writes and/or data reads during operation of the memory system 104. The error correction component 106 can communicate with the memory system 104 using this information to instruct the memory system 104 to write data to, or read data from, particular sectors of the memory devices 112-1 to 112-N to provide wear leveling to the memory system 104. By controlling wear leveling operations using the error correction component 106, circuitry present on the memory system 104 that is used to control wear leveling operations in some approaches may be reduced or eliminated, which can free up additional space on the memory system 104 for other purposes, such as additional storage.

After the error correction component 106 has performed error correction operations (e.g., initial error correction operations and/or post-error correction operations) on the data, the host 102 can use the error corrected data in performance of a host computing operation. Embodiments are not so limited, however, and in some embodiments, once the error correction component 106 has performed error correction operation(s) o the data, the error correction component 106 can cause the data to be transferred back to the memory system 104 to be stored by the memory devices 112.

The controller 110 can communicate with the memory devices 112-1 to 112-N to control data read, write, and erase operations, among other operations. The controller 110 can include, for example, a number of components in the form of hardware and/or firmware, e.g., one or more integrated circuits, such as application-specific integrated circuit(s) (ASIC(s)), field-programmable gate array(s) (FPGA(s)), and/or software for controlling access to the number of memory devices 112-1 to 112-N and/or for facilitating data transfer between the host 102 and memory devices 112-1 to 112-N. The controller 110 can include various components not illustrated so as not to obscure embodiments of the present disclosure to control data read, write, erase, etc. operations. Such components may not be components of controller 110 in some embodiments, e.g., the components to control data read, write, erase, etc. operations can be independent components located within the memory system 104.

The memory devices 112-1 to 112-N can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes.

The memory devices 112-1 to 112-N can include volatile memory and/or non-volatile memory. In a number of embodiments, memory devices 112-1 to 112-N can include a multi-chip device. A multi-chip device can include a number of different memory types and/or memory modules. For example, a memory system can include non-volatile or volatile memory on any type of a module. In embodiments in which the memory devices 112-1 to 112-N include non-volatile memory, the memory devices 112-1 to 112-N can be flash memory devices such as NAND or NOR flash memory devices. Embodiments are not so limited, however, and the memory devices 112-1 to 112-N can include other non-volatile memory devices such as non-volatile random-access memory devices (e.g., NVRAM, ReRAM, FeRAM, MRAM, PCM), "emerging" memory devices such as resistance variable (e.g., 3-D Crosspoint (3D XP)) memory devices, memory devices that include an array of self-selecting memory (SSM) cells, etc., or combinations thereof. Resistance variable memory devices can perform bit storage based on a change of bulk resistance, in conjunction with a stackable cross-gridded data access array. Additionally, in contrast to many flash-based memories, resistance variable non-volatile memory can perform a write in-place operation, where a non-volatile memory cell can be programmed without the non-volatile memory cell being previously erased. In contrast to flash-based memories and resistance variable memories, self-selecting memory cells can include memory cells that have a single chalcogenide material that serves as both the switch and storage element for the memory cell.

The memory devices 112-1 to 112-N can provide main memory for the computing system 100 or can be used as additional memory or storage throughout the computing system 100. Each memory device 112-1 to 112-N can include one or more arrays of memory cells, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

In some embodiments, the memory system 104 can include a processing unit 111, which can include a memory resource 113. The processing unit can be a processor, one or more co-processors, a reduced instruction set computing (RISC) device, etc. that can be configured to perform operations on the data stored in the memory devices 112-1 to 112-N. In embodiments in which the processing unit 111 is a RISC device, the RISC device can be a processing resource that can employ a reduced instruction set architecture (ISA) such as a RISC-V ISA, however, embodiments are not limited to RISC-V ISAs and other processing devices and/or ISAs can be used.

The processing unit 111 can be configured to perform operations on data that are stored in the memory device 112-1 to 112-N. For example, the processing unit 111 can receive data (e.g., uncorrected bits or data that has not had an error correction operation performed thereon) form the memory devices 112-1 to 112-N and can perform an operation on the block of data in which at least some of the data is ordered, reordered, removed, or discarded to selectively remove or otherwise alter portions of the data prior to transferring the data to the error correction component 106 and/or the host 102.

The memory resource 113 can, in some embodiments, be a memory resource such as random-access memory (e.g., RAM, SRAM, etc.). Embodiments are not so limited, however, and the memory resource 113 can include various registers, caches, buffers, and/or memory arrays (e.g., 1T1C, 2T2C, 3T, etc. DRAM arrays). The memory resource 113 can be configured to receive uncorrected blocks of data from, for example, a memory device such as the memory devices 112-1 to 112-N. In some embodiments, the memory resource 113 can have a size of approximately 256 kilobytes (KB), however, embodiments are not limited to this particular size, and the memory resource 113 can have a size greater than, or less than, 256 KB.

In some embodiments, the processing unit 111 can provide data driven performance of operations on uncorrected data received from the memory device(s) 112-1 to 112-N. For example, the processing unit 111 can begin performing operations on data (e.g., operations to reduce a size of the block of data, to extract relevant information from the block of data, to remove irrelevant information from the data, etc.) received from the memory device(s) 112-1 to 112-N in response to receipt of the data.

For example, because of the non-deterministic nature of data transfer from the memory device(s) 112-1 to 112-N to the processing unit 111 (e.g., because some blocks of data may take longer to arrive at the processing unit 111 due to operations performed by the controller 110 prior to transfer of the data to the processing unit 111, etc.), data driven performance of the operations on the data can improve computing performance in comparison to approaches that do not function in a data driven manner.

In some embodiments, the operation can be performed by selectively moving data around in the memory resource 113 to extract relevant data from the uncorrected data or to remove irrelevant data from the data. In a non-limiting example in which two columns of data A and B are requested from uncorrected data containing three columns of data A, B, and C, the uncorrected data containing all three columns can be transferred to a first partition of the memory resource 113.

The processing unit 111 can execute instructions to cause the first two columns A and B (e.g., the requested or relevant data) of the uncorrected data containing the three columns to be selectively moved to a different partition of the memory resource 113. At this stage, the "filtered" uncorrected data that contains only the relevant or requested columns A and B can be transferred to circuitry external to the processing unit 111, such as the host 102 and/or the error correction component 106 for performance of an error correction operation. Although described above in the context of a "filtered" block of data, embodiments are not so limited, and the processing unit 111 can perform other operations, such as operations in which at least some of the data is ordered, reordered, removed, or discarded, arithmetic operations, and/or logical operations on the uncorrected data in a similar manner.

The embodiment of FIG. 1 can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the memory devices 112-1 to 112-N. It will be appreciated by those skilled in the art that the number of address input connections can depend on the density and architecture of the memory devices 112-1 to 112-N.

Figure 2A:
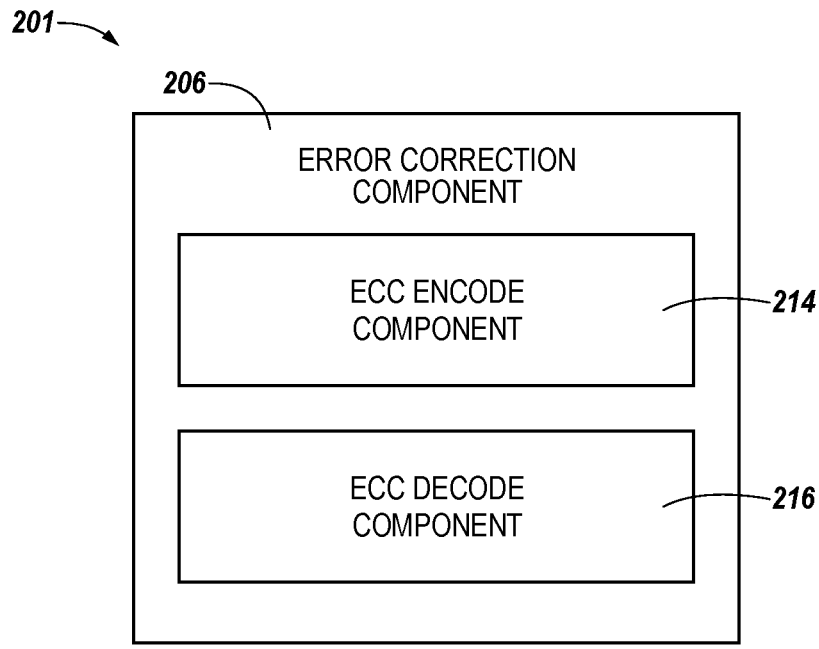
FIG. 2A is a functional block diagram in the form of an apparatus including an error correction component in accordance with a number of embodiments of the present disclosure.
Figure 2B:
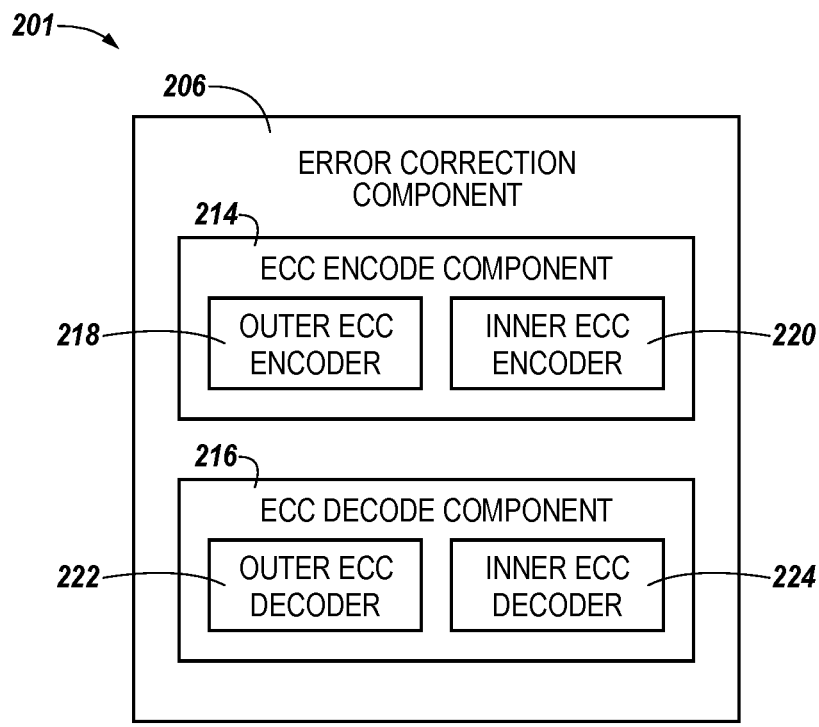
FIG. 2B is another functional block diagram in the form of an apparatus including an error correction component in accordance with a number of embodiments of the present disclosure.

FIGS. 2A and 2B are functional block diagrams in the form of apparatuses 201 including an error correction component 206 in accordance with a number of embodiments of the present disclosure. The error correction component 206 can be analogous to the error correction component 106 illustrated in FIG. 1, herein. As shown in FIG. 2A, the error correction component 206 can include an error correction code (ECC) encode component 214 and an ECC decode component 216. As shown in FIG. 2B, the ECC encode component 214 further includes an outer ECC encoder 218 and an inner ECC encoder 220, while the ECC decode component 216 further includes an outer ECC decoder 222 and an inner ECC decoder 224. The error correction component 206 can be resident on (e.g., physically deployed on) a host, such as the host 102 illustrated in FIG. 1.

The ECC encode component 214 and the ECC decode component 216 can include, for example, a number of components in the form of hardware and/or firmware, e.g., one or more integrated circuits, such as application-specific integrated circuit(s) (ASIC(s)), field-programmable gate array(s) (FPGA(s)), and/or software for performing error correction operations on data transferred between a host (e.g., the host 102 illustrated in FIG. 1) and memory devices (e.g., the memory devices 112-1 to 112-N illustrated in FIG. 1).

The ECC encode component 214 can be implemented as a BCH encoder and/or an iterative encoder such as an LDPC encoder, or other suitable encoder to encode data received from a memory system as part of performance of an error correction operation on the received data. Similarly, the ECC decode component 216 can be implemented as a BCH decoder and/or an iterative decoder such as an LDPC decoder, or other suitable decoder to decode data received from a memory system as part of performance of an error correction operation on the received data.

As described above, the error correction component 206 can receive data from a memory system (e.g., the memory system 104 illustrated in FIG. 1) and perform an error correction operation on the data. Performance of an error correction operation can include implementing one or more error correction codes (ECC(s)) to correct for errors in the data and/or implementing a CRC to detect for errors in the data.

In some embodiments, the ECC encode component 214 and/or the ECC decode component 216 can implement multiple tiers of encoding and/or decoding. For example, the ECC encode component 214 and/or the ECC decode component 216 can include one or more outer ECC encoders 218 and/or outer ECC encoders 222 in addition to one or more inner ECC encoders 220 and/or inner ECC decoders 224. For example, the ECC encode component 214 can include an outer ECC encoder 218 in the form of a BCH encoder and an inner ECC encoder 220 in the form of an LDPC encoder. Similarly, the ECC decode component 216 can include an outer ECC decoder 222 in the form of a BCH decoder and an inner ECC decoder 224 in the form of an LDPC decoder. Embodiments of the present disclosure are not limited to the particular quantities and/or types of code encoders/decoders set forth above, however, and can include additional encoders/decoders, and/or different types or ordering of encoding/decoding than those described above.

According to various embodiments of the present disclosure, the ECC encode component 214 and/or the ECC decode component 216 can selectably implement an all LDPC ECC scheme (e.g., using the ECC encode component 214 and the ECC decode component 216) or a concatenated ECC scheme which has an inner LDPC code and an outer BCH code (e.g., using the outer ECC encoder 218, the inner ECC encoder 220, the outer ECC decoder 222, and the inner ECC decoder 224). In the concatenated ECC scheme, an LDPC decoder can run for 1 or 2 iterations, for example. The residual errors after the 1 or 2 iterations can be corrected by component(s) implementing, for example, the outer BCH code.

A precision rich LDPC decoder can be used such that the LDPC decoder can be controlled to a desired quantity of iterations. The all LDPC ECC scheme can support higher residual bit error rate (RBER) performance compared to the concatenated ECC scheme, e.g., concatenation of an LDPC code with an outer/inner code, in both hard and soft modes for certain applications provided that it can run as many iterations as needed. The all LDPC ECC scheme can provide a variable throughput rate, depending on the number of LDPC decoder iterations and the available hardware resources. However, the all LDPC ECC scheme can require more decoder iterations to reach a same RBER performance compared to the concatenated ECC scheme and utilizes a more complex ECC decode component 216. Higher decoder iterations translate to higher decoder power.

The concatenated ECC scheme, for instance with an LDPC decoder implementing 1 or 2 iterations, can be implemented with a relatively less complex ECC encode component 214 and/or ECC decode component 216, can require fewer iterations, can use less power than the all LDPC ECC scheme, and can provide sustained throughput (for some applications). However, the concatenated ECC scheme does not provide as high a RBER performance compared to the all LDPC ECC scheme at RBER regions corresponding to end of life RBER after cycling and retention effects on Flash memory, for example.

According to some embodiments, for applications limited to 1 or 2 iterations of an LDPC decoder, e.g., for power and hardware constraints, the concatenated ECC scheme performs better than the all LDPC ECC scheme, and for applications that are not limited to 1 or 2 iterations of an LDPC decoder, the all LDPC ECC scheme performs better than the concatenated ECC scheme.

In some approaches, for example, in approaches in which error correction operations are performed on a memory system (e.g., the memory system 104 illustrated in FIG. 1) using, for example, a media controller (e.g., the controller 110 illustrated in FIG. 1), the above considerations (e.g., the trade-offs between power consumption, RBER performance, time allowed to perform ECC iterations, available hardware resources, etc.) may be critical due to limited power, time, hardware resources, and/or space available to the memory system. In contrast, by performing error correction operations on a host (e.g., the host 102 illustrated in FIG. 1) using the error correction component 206, resources (e.g., time, power, hardware resources, etc.) available to perform error correction operations can be increased in comparison to approaches in which error correction operations are performed on the memory system. This can improve the robustness of the error correction operations, which can lead to reduced RBER and increased data integrity.

Figure 3:
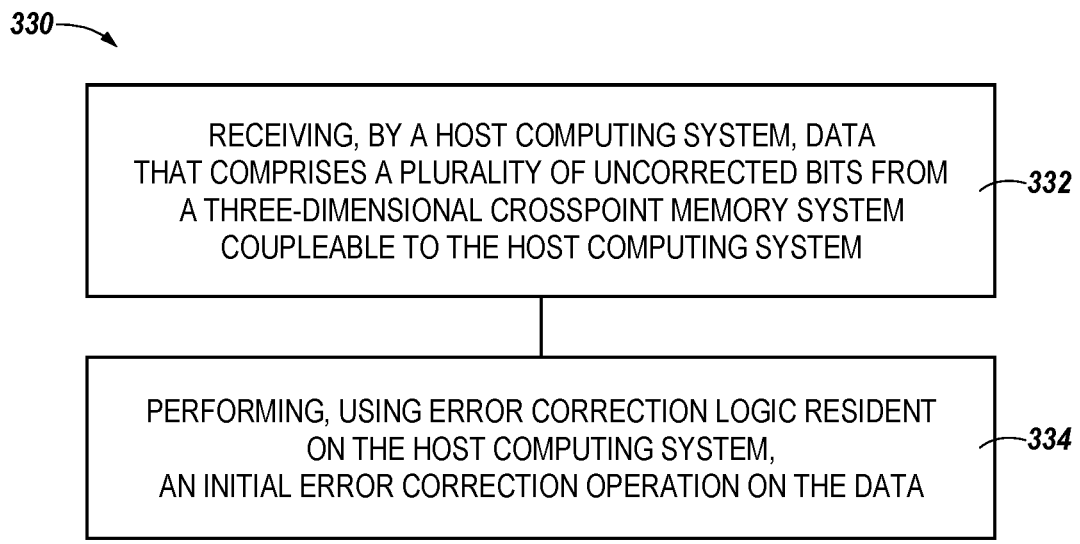
FIG. 3 is a flow diagram representing an example method for host-based error correction in accordance with a number of embodiments of the present disclosure.

FIG. 3 is a flow diagram representing an example method 330 for host-based error correction in accordance with a number of embodiments of the present disclosure. At block 332, the method 330 can include receiving, by a host computing system, data that comprises a plurality of uncorrected bits from a resistance variable memory system (e.g., a phase change memory system, a resistive memory system, a three-dimensional Crosspoint (3D XP) memory system, etc.) coupleable to the host computing system. The host computing system can be analogous to the host 102 illustrated in FIG. 1, herein, and the 3D XP memory system can be analogous to the memory system 104 and/or memory devices 112 illustrated in FIG. 1, herein. Embodiments are not limited to a resistance variable memory device, however, and in some embodiments, the memory device can be a flash-based memory system or "emerging" memory system, such as a memory device that includes an array of self-selecting memory cells.

At block 333, the method 330 can include determining an acceptable error range for the data based at least in part on an application associated with the data. In some embodiments, determining the acceptable error range for the data can include determining a desired quality level for the data. The desired quality level can include a maximum number of uncorrectable bits, a maximum acceptable residual bit error rate, or other suitable data error quality metric.

For example, if it is desired that the data contain as few errors as possible (e.g., if the data is critical to operation of the computing system, if the data is being used in an application that demands stringent data quality, etc.), the data may be error corrected using error correction logic resident on the host, as described at block 334. In some embodiments, the acceptable error range for the data can correspond to whether the host requests the data or if a different component of the computing system requests the data. For example, if the host requests the data, the acceptable error range for the data may be relatively low and, accordingly, the data may be error corrected using error correction logic resident on the host, as described at block 334. By dynamically determining whether the data is to be error corrected using error correction logic resident on the host, embodiments herein can allow high performance error correction to be performed on data requested by the host (e.g., using the error correction logic resident on the host), while data that does not require as stringent error correction can be performed elsewhere (e.g., using a memory controller on a memory device coupled to the host).

At block 334, the method 330 can include performing, using error correction logic resident on the host computing system, an initial error correction operation on the data based at least in part on the acceptable error range. The error correction operation can, in some embodiments, be performed by error correction logic (e.g., the error correction component 106/206 illustrated in FIGS. 1 and 2, herein) resident on the host computing system. The initial error correction operation can be, as described above, an error correction operation that is performed on a plurality of uncorrected bits (e.g., data/bits that have not been error corrected by the memory system prior to being received by the host computing system). In some embodiments, the method 330 can include encoding, by the host computing system, the received data as part of performing the error correction operation and decoding, by the host computing system, the encoded data as part of performing the error correction operation. In some embodiments, the data can be encoded by an ECC encoding component such as the ECC encode component 214 illustrated in FIGS. 2A and 2B, and the data can be decoded by an ECC decoding component such as the ECC decode component 216 illustrated in FIGS. 2A and 2B.

As described above in connection with FIG. 2, encoding the received data can include encoding the data according to a first error correction scheme and decoding the encoded data can include decoding the encoded data according to the first error correction scheme. Embodiments are not so limited, however, and in some embodiments, encoding the received data can include encoding the data according to a first error correction scheme, and decoding the encoded data can include decoding the encoded data according to a second error correction scheme. That is, in some embodiments, the error correction scheme used to encode the data can be different than an error correction scheme used to decode the data.

In some embodiments, the method 330 can include performing, using a processing device coupled to the three-dimensional Crosspoint memory array, an operation on the data in which at least some of the data is ordered, reordered, removed, or discarded prior to performing the initial error correction. For example, the memory system (e.g., the memory system 104 illustrated in FIG. 1) can include a processing unit that can be configured to perform an operation on the data (e.g., the plurality of uncorrected bits) in which at least some of the data is ordered, reordered, removed, or discarded to selectively remove or otherwise alter portions of the data prior to transferring the data to the error correction logic and/or the host computing system.

The method 330 can further include performing the error correction operation further comprises performing, by the host computing device, the error correction operation without performing an error correction operation using the memory system. For example, as described above, the host computing system can receive uncorrected data from the memory system and perform the error correction operation on the uncorrected received data. In some embodiments, performing the error correction operation without performing an error correction operation using the memory system can include performing the error correction operation on the host computing device without the memory system (e.g., without a controller such as the controller 110 illustrated in FIG. 1) performing any error correction on the data prior to receipt of the data by the host computing system.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
receiving, by an error correction circuitry comprising an error correction code (ECC) encode circuitry and an ECC decode circuitry, data from a memory device; and
performing, by the error correction circuitry, an initial error correction operation on the data without performing an error correction operation using the memory device or a media controller associated with the memory device.

2. The method of claim 1, wherein the error correction circuitry is deployed on a host computing system coupled to the memory device.

3. The method of claim 1, further comprising encoding the data according to at least one of a first error correction scheme (ECS) and a second ECS as part of performance of the initial error correction operation.

4. The method of claim 3, further comprising decoding the encoded data according to the at least one of the first ECS and the second ECS as part of performance of the initial error correction operation.

5. The method of claim 1, further comprising transferring the error corrected data to the memory device.

6. An apparatus, comprising:
a host computing system; and
an error correction circuitry deployed on the host computing system, wherein the error correction circuitry comprises an error correction code (ECC) encode circuitry and an ECC decode circuitry, and wherein the error correction circuitry is configured to:
receive data from a memory device coupled to the host computing system; and
perform an initial error correction operation on the data without performing an error correction operation using a media controller associated with the memory device.

7. The apparatus of claim 6, wherein the error correction circuitry is further configured to cause the error corrected data to be transferred to the memory device coupled to the host computing device.

8. The apparatus of claim 6, wherein:
the ECC encode circuitry is configured to encode the data according to at least one of a first error correction scheme (ECS) and a second ECS as part of performance of the initial error correction operation, or
decode the encoded data according to the at least one of the first ECS and the second ECS as part of performance of the initial error correction operation.

9. The apparatus of claim 6, wherein the host computing system is configured to use the error corrected data in performance of a host computing operation.

10. The apparatus of claim 6, wherein the error correction circuitry is configured to:
receive the data when the data is encoded; and
decode the data according to an error correction scheme as part of performance of the initial error correction operation.

11. A system, comprising:
a memory device coupled to a media controller;
a host computing system coupled to the memory device; and
an error correction circuitry deployed on the host computing system, wherein the error correction circuitry comprises an error correction code (ECC) encode circuitry and an ECC decode circuitry, and wherein the error correction circuitry is configured to:
receive data from the memory device; and
perform an initial error correction operation on the data without performing an error correction operation using the media controller.

12. The system of claim 11, wherein the error correction circuitry is further configured to cause the error corrected data to be transferred to the memory device.

13. The system of claim 11, wherein the ECC encode circuitry is configured to encode the data according to at least one of a first error correction scheme (ECS) and a second ECS as part of performance of the initial error correction operation.

14. The system of claim 13, wherein the ECC decode circuitry is configured to decode the encoded data according to the at least one of the first ECS and the second ECS as part of performance of the initial error correction operation.

15. The system of claim 11, wherein the initial error correction operation is performed by the error correction circuitry without performing an error correction operation using the memory device.

16. The system of claim 11, wherein the host computing system is configured to use the error corrected data in performance of a host computing operation.

17. The system of claim 11, wherein the error correction circuitry is configured to:
- receive encoded data form the memory device; and
- decode the data according to an error correction scheme as part of performance of the initial error correction operation.

* * * * *